Sept. 22, 1959 C. C. RAYBURN ET AL 2,905,744

MODULE WAFER SUPPORT FOR ELECTRICAL COMPONENTS

Filed Dec. 27, 1956 2 Sheets-Sheet 1

INVENTORS
Charles C. Rayburn
James G. Black Jr.
BY
Donald P. Smith
Attorney

Sept. 22, 1959 C. C. RAYBURN ET AL 2,905,744

MODULE WAFER SUPPORT FOR ELECTRICAL COMPONENTS

Filed Dec. 27, 1956 2 Sheets-Sheet 2

INVENTORS
Charles C. Rayburn
James G. Black Jr.

BY Donald P. Smith
Attorney

United States Patent Office 2,905,744

Patented Sept. 22, 1959

2,905,744

MODULE WAFER SUPPORT FOR ELECTRICAL COMPONENTS

Charles C. Rayburn and James G. Black, Jr., Falls Church, Va., assignors to ACF Industries, Incorporated, New York, N.Y., a corporation of New Jersey Application December 27, 1956, Serial No. 630,939

9 Claims. (Cl. 174—138)

In recent years the growing complexity of the electronics arts has given rise to a number of new techniques for the rapid fabrication of circuits. Among these may be mentioned printed circuitry wherein an assemblage of conductors is formed on an insulating member by any one of a number of known methods and electrical components are secured to the surface in bridging relationship to gaps left in the conductors whereby a circuit is established. The modular technique has also been developed as a preferred form of circuit miniaturization. One type of module consists of a series of ceramic wafers arranged in parallel spaced plans and held fixed by means of conductive wires lying in notches formed in the edges of the members and soldered thereto. As an illustration see Patent No. 2,774,014 to Robert L. Henry, Jr. issued December 11, 1956, on an application filed October 31, 1952, and assigned to the United States of America. The purpose of the plate members is to provide surfaces on which to carry electrical components and the wires afford conductors to interconnect the components lying on the surfaces. It has been found expeditious in circuit fabrication to secure a module, as previously described, to a printed circuit panel by forming an aperture in the panel and passing the assemblage of conductive strands through the aperture and bending them back upon themselves to engage against the terminals of conductors interrupted at the edges of the aperture.

This invention is concerned primarily with one portion of the above-described module, namely the plate having an edge notch construction adapted to readily receive the conductive strands and upon their being soldered thereto to bond the several members together with great firmness to resist separating forces and to afford an excellent electrical connection. The invention, as will be more fully explained hereinafter, contemplates the forming of edge notches with a portion thereof disposed below the wafer surface wherein to receive a mass of low temperature melting alloy, such as solder.

It is accordingly a broad object of this invention to improve on the circuit assemblies now in use.

It is another object of the invention to provide a planar circuit panel having a novel edge configuration for supporting electrical components.

It is a further object of this invention to provide a modular wafer member having edge notches wherein a portion of the notch is formed to lie below the wafer surface.

Other objects and advantages will be in part obvious and in part pointed out in the following specification taken in consideration with the drawings in which.

Figures 1, 2, 3:
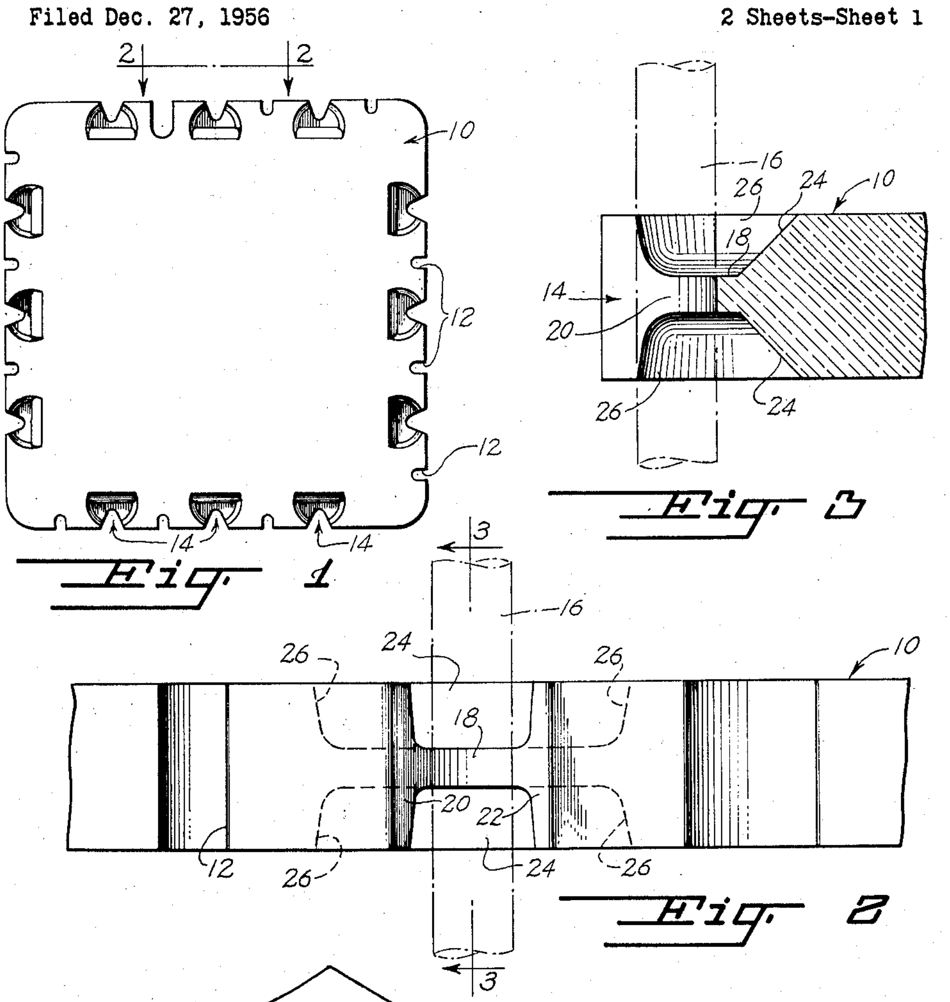
Figure 1 is a top plan view of a module wafer in accordance with the present invention.
Figure 2 is a partial elevation view taken on lines 2—2 of Figure 1 and looking in the direction of the arrows.
Figure 3 is a longitudinal elevation partly in section taken on lines 3—3 of Figure 2 and looking in the direction of the arrows.

Referring now to the drawings wherein like reference characters designate like or corresponding parts throughout, a module wafer 10 is illustrated in Figures 1 to 4 inclusive to consist of a planar member of a ceramic material having good dielectric properties and high mechanical strength to receive and support electrical components for connection into an external circuit. A series of minor kerfs 12 are formed in each edge of the member to extend the spacing between adjacent wire receiving openings. The kerfs 12 serve another useful function in that one of the operations necessary to affix a copper conductor onto a ceramic surface consists of metalizing, with silver, the ceramic surface prior to the application thereto of solder. It has been found that silver in finely divided form when applied to a ceramic surface and baked thereon adheres firmly thereto and serves as a joining agent to bond solder to the ceramic. The preferred method of applying the silver to the notches is to spray it on and any spraying operation must of necessity have a certain amount of excess coverage which impacts against and adheres to the adjacent surfaces. This excessive metal is a conductor and always tends to lower the dielectric properties of the ceramic causing undue leakage between components and lowering insulation resistance between component terminals. The aforementioned minor kerfs 12 have been found to serve as a barrier or hiatus to continuity between adjacent conductors.

Figure 4:
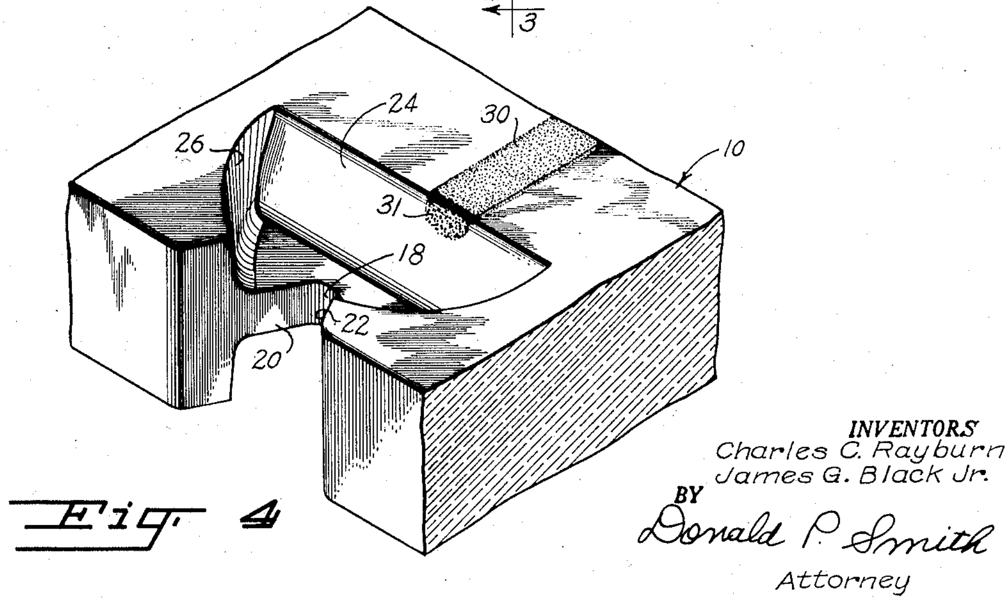
Figure 4 is a perspective view of an edge portion of the wafer showing in detail the construction of one embodiment of the notch.

The openings or major kerfs 14 are adapted to receive conductive wire strands 16 shown in phantom outline. The conductors are placed into the notches until they abut against the apex substantially as there shown. In Figures 2, 3 and 4 the apex of the notch is designated by reference character 18 as that portion joining between the divergent legs 20 and 22. A pair of cup-like depressions are formed in both member surfaces having rearwardly sloping end walls 24 and arcuate side walls 26 joining between the end wall 24 and the outwardly flaring kerf substantially as shown in Figure 4. These cup-shaped depressions are adapted to receive the sprayed silver and after application of the conductor into the kerf, as shown in Figure 3, a low melting point alloy such as solder is applied, usually by a dipping process; which fills the entire depression and firmly bonds between the conductor and the wafer. It has been found that the pool of solder resting in the depressions resists with great force any forces tending to remove the conductor from the opening, the walls 26 serving to react against displacing forces. A single conductive path 30 is shown on the surface on the member 10 and is arranged to extend down into the cavity as there indicated by reference character 31. This extension insures a good contact between the metal resting in the cavity and the conductor extending on the wafer surface to thereby interconnect the riser wire with whatever component terminal may be selected.

Figure 5:
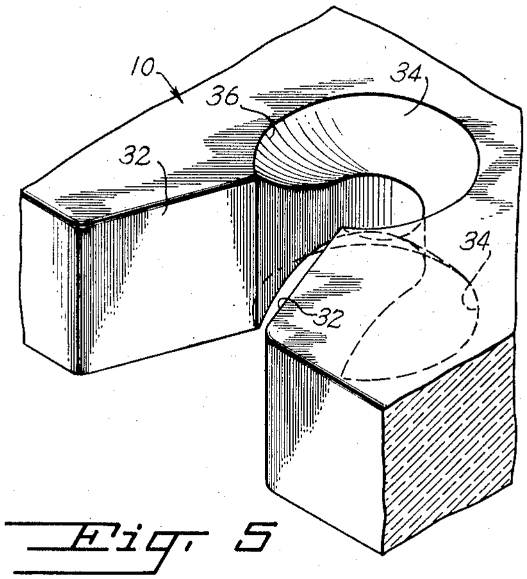
Figure 5 is a perspective view of another embodiment of the edge notch.
Figure 6:
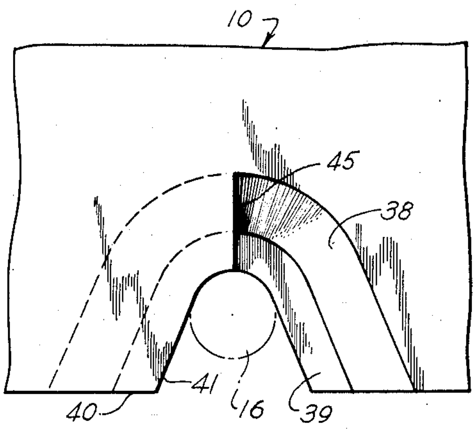
Figure 6 is a top plan view of still another embodiment of the invention.
Figure 8:
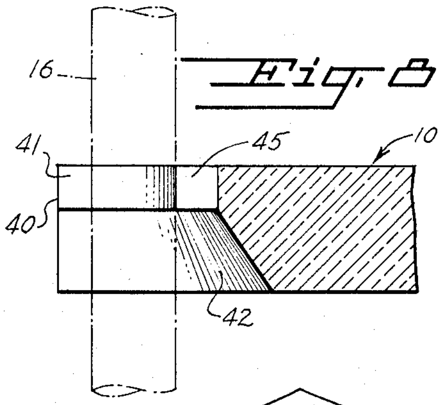
Figure 8 is an elevation partly in section taken on lines 8—8 of Figure 7 and looking in the direction of the arrows.
Figure 7:
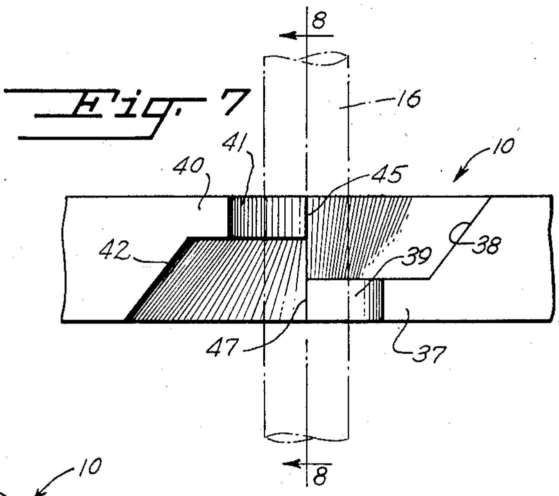
Figure 7 is an elevation of the embodiment of Figure 6.

Reference is now made to the species of the invention disclosed in Figure 5. Planar member 10 is shown to have a conductor receiving opening formed of at least two portions. A first portion comprising a V groove has divergent legs 32 flaring outwardly to the wafer edge, and a second portion consists of a pair of depressed annular cups 34 joining into the V groove at the apex thereof. The V groove is arranged to receive the conductor, as previously described and the cups 34 are filled with solder, or other low melting point alloy after the entire opening has been coated by spraying or other method with metallic silver to firmly bond wire to the ceramic wafer. As in the previously described embodiment the walls designated generally by 36 of arcuate configuration react against forces tending to displace the conductive strand with its attached solder from the groove. It has been found that failure upon application of excessive stress lies in the ceramic itself rather than in the bond between the ceramic and the metal, thus indicating the degree of bonding adhesion.

Figure 9:
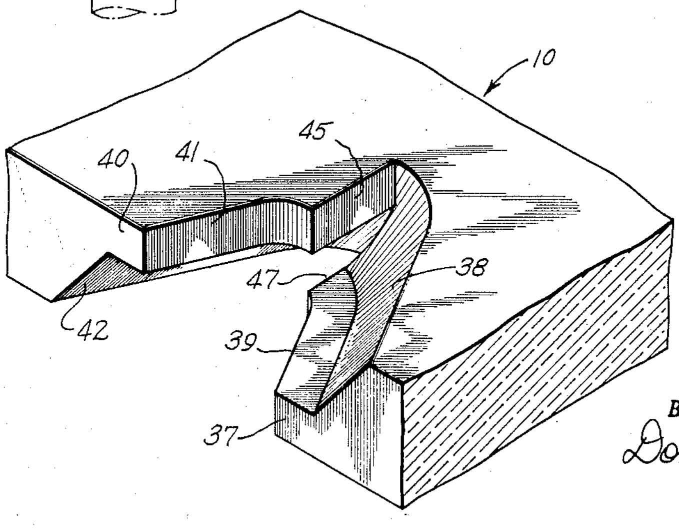
Figure 9 is a perspective view of the embodiment of Figures 6, 7 and 8.

In Figures 6, 7, 8 and 9 a further embodiment is disclosed. There the ceramic wafer 10 has formed an outwardly flaring V groove wherein the divergent legs (39, 41) of the V are arranged in spaced horizontal planes as is best seen in Figure 9. A detailed inspection reveals that one groove side has a shoulder 37 extending from the lower member surface and forming one leg 39 of the V which makes an angle with a vertical plane normal to the wafer edge bisecting the V-groove. Leg 39 of the V-groove has a sloping wall 38 joining it to the upper wafer surface. The other side of each V-groove is formed with a shoulder 40 extending from the upper surface of member 10. The second leg 41 of the V-groove is disposed at an equal angle with the vertical plane normal to the edge of member 10 as is leg 39. A sloping wall 42 joins leg 41 with the lower surface of member 10. Surfaces 45 and 47 are respectively formed at the ends of legs 41 and 39 and lie spaced on the vertical plane normal to the edge of member 10. As seen from Figures 7 and 8 the wire 16 lies against the apex of the V. The volume formed between the sloping walls 38 and 42 is arranged to receive solder to firmly bond the wire to the ceramic member after the silver coating cycle.

All of the embodiments are arranged to receive the ends of conductive paths leading to component terminals, and the several embodiments here disclosed represent a substantial improvement over the prior art of the type disclosd in the Henry patent, supra; whereby conductors may be firmly bonded to ceramic supporting structure and the groove configuration causes the ceramic material itself to resist forces tending to displace the wire from the groove.

While there has been illustrated and described a number of embodiments of the invention it is possible to make variations and modifications therefrom without necessarily departing from the spirit and scope of the invention as set forth in the appended claims.

We claim:

1. A support for electrical components comprising a planar member, a series of conductor-receiving kerfs formed on each edge of said member, each one of said kerfs including a first portion formed with a V-groove extending from one edge of said member and a second portion having a cavity extending from one surface of said member and surrounding the apex of said V-groove, said cavity being spaced from said one edge of said member.

2. A support for electrical components comprising a planar member, a plurality of conductor-receiving kerfs formed in the edges of said member, each of said kerfs including a first portion having a V-groove flaring outwardly to one edge of said member, said each kerf including a second portion surrounding the apex of said V-groove and comprising a shallow cup formed in one surface of said member and having a wall spaced inwardly from the apex of said V-groove and forming an angle with said member surface, said cup being a substantially greater width than the mouth of said V-groove, said cup between said wall and said V-groove fashioned with an arcuate configuration.

3. A support for electrical components comprising a planar member, a plurality of conductor-receiving kerfs formed in the edges of said member, each of said kerfs having a V-groove flaring outwardly to one edge of said member and extending laterally from one surface to the oposite surface of said member, said each kerf formed with a first shallow cup extending from said one surface of said member and a second shallow cup extending from said opposite surface of said member, said cups surrounding the apex of said V-groove, said first and second cups having a different wall portion spaced inwardly from said apex of said V-groove and forming an angle respectively with said one and said opposite surfaces of said member, said cups each defining a substantially greater width than the V-groove and having an arcuate configuration between said apex of said V-groove and said respective wall.

4. The invention as set forth in claim 3 including a plurality of spacing kerfs formed in the edges of said member with each one of said spacing kerfs arranged between a different pair of said conductor-receiving kerfs.

5. A support for electrical components comprising a planar member, a series of conductor-receiving kerfs formed on each edge of the member, each said kerf having one side formed to have a shoulder extending from the lower member surface forming a horizontal angle with a plane normal to the edge and a sloping wall joining between the shoulder and the upper member surface, the other side formed to have a shoulder extending from the upper member surface forming an equal horizontal angle with the plane normal to the edge and a sloping wall joining between the shoulder and the lower member surface, the said plane forming the boundary area for the said shoulders and sloping walls at the apex of the kerf.

6. The invention as set forth in claim 5 including a series of spacing kerfs formed in the member edges and arranged between respective conductor-receiving kerfs.

7. A support for electrical components comprising a planar member, a series of conductor-receiving kerfs formed on each edge of the member, a first portion of each respective kerf comprising a V groove extending from the upper to the lower surface and flaring outwardly to the edge, and a second portion of each kerf comprising at least one annular cup formed in the surface and joining into the V groove at the apex thereof, the said first portion arranged to receive a conductor at the apex, and the said first and second portion disposed to receive a low melting point alloy to bond the conductor to the member.

8. The invention as set forth in claim 7 including a series of separating kerfs arranged between successive conductor receiving kerfs.

9. The invention as set forth in claim 8 wherein the said second portion of each kerf comprises two cups disposed respectively in the upper and lower surface of the member.

References Cited in the file of this patent

UNITED STATES PATENTS

| | | |
|---|---|---|
| 2,636,919 | Mensch | Apr. 28, 1953 |
| 2,774,014 | Henry | Dec. 11, 1956 |

FOREIGN PATENTS

| | | |
|---|---|---|
| 244,106 | Great Britain | July 29, 1926 |

OTHER REFERENCES

Tele-Tech, December 1955, pages 74, 75.